(12) United States Patent
Sano

(10) Patent No.: US 8,573,086 B2
(45) Date of Patent: Nov. 5, 2013

(54) LEVER OPERATION DEVICE

(75) Inventor: Tadashi Sano, Miyagi-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 384 days.

(21) Appl. No.: 13/034,642

(22) Filed: Feb. 24, 2011

(65) Prior Publication Data
US 2011/0219895 A1    Sep. 15, 2011

(30) Foreign Application Priority Data

Mar. 11, 2010  (JP) ................................. 2010-054872

(51) Int. Cl.
*F16H 1/02* (2006.01)
(52) U.S. Cl.
USPC .............................. 74/412 R; 74/528; 74/533
(58) Field of Classification Search
USPC ................ 74/412 R, 519, 520, 523, 528, 533
See application file for complete search history.

(56) References Cited

U.S. PATENT DOCUMENTS

| | | | | |
|---|---|---|---|---|
| 3,556,270 A | * | 1/1971 | Comment | 477/191 |
| 3,622,722 A | * | 11/1971 | Jackson et al. | 200/61.39 |
| 5,514,048 A | * | 5/1996 | Jacobson et al. | 477/99 |
| 5,647,465 A | * | 7/1997 | Burkhard et al. | 192/220.4 |
| 6,247,378 B1 | * | 6/2001 | Newendorp et al. | 74/473.12 |
| 6,756,698 B2 | * | 6/2004 | Shamoto et al. | 307/10.6 |
| 6,799,488 B2 | * | 10/2004 | Snell | 74/552 |
| 7,401,483 B2 | * | 7/2008 | Dimig et al. | 70/277 |
| 8,149,557 B2 | * | 4/2012 | Dimig et al. | 361/143 |
| 8,230,754 B2 | * | 7/2012 | Song et al. | 74/470 |
| 2009/0231072 A1 | | 9/2009 | Urakawa et al. | |

FOREIGN PATENT DOCUMENTS

JP    2009-224057    10/2009

* cited by examiner

*Primary Examiner* — David M Fenstermacher
(74) *Attorney, Agent, or Firm* — Beyer Law Group LLP

(57) ABSTRACT

A rotating knob is rotatably attached to an outer peripheral portion of an operation lever. The rotating knob has a lead thread portion on the inner surface thereof, and the lead thread portion meshes with external teeth of a ring gear. Internal teeth of the ring gear mesh with speed-increasing gears, and permanent magnets are fixed to the speed-increasing gears. A circuit board is arranged in the operation lever so as to extend along the axial direction thereof, and magnetic sensors mounted on the circuit board are opposed to the permanent magnets at positions close thereto. Accordingly, the operation position of the rotating knob can be detected by the magnetic sensors. The gears, the circuit board, etc., are supported by a support case and a cover case to form a switch unit.

7 Claims, 14 Drawing Sheets

LEVER OPERATION DEVICE

CLAIM OF PRIORITY

This application claims benefit of Japanese Patent Application No. 2010-054872 filed on Mar. 11, 2010, which is hereby incorporated by reference.

BACKGROUND OF THE INVENTION

1. Field of the Invention

The present invention relates to lever operation devices suitable for use as, for example, turn signal switch devices or wiper switch devices of automobiles. More specifically, the present invention relates to a lever operation device capable of outputting various operation signals when operation members, such as a rotating knob, arranged on the outer periphery of an operation lever are operated.

2. Description of the Related Art

Lever operation devices used as turn signal switch devices or wiper switch devices of automobiles generally include a columnar operation lever that projects from a housing fixed to, for example, a steering column The operation lever can be pivoted along two operation planes that are substantially orthogonal to each other. The operation lever is selectively operated along the individual operation planes, and a plurality of types of operation signals are output in accordance with the direction in which the operation lever is operated. Lever operation devices having operation members, such as a rotating knob, on the outer periphery of the operation lever are also known. Such a lever operation device outputs operation signals corresponding to operations of the operation members (for example, rotation of the rotating knob).

Recently, lever operation devices having a long-life detection mechanism capable of detecting the operation position of the rotating knob have been proposed (see, for example, Japanese Unexamined Patent Application Publication No. 2009-224057). Such a lever operation device according to the related art includes a driven member driven by the rotating knob, a permanent magnet fixed to the driven member, and a magnetic sensor mounted on a circuit board in an inner space of the operation lever. The driven member and the permanent magnet are moved or rotated together in response to the rotation of the rotating knob. Accordingly, a variation in magnetic field caused by the movement or rotation of the permanent magnet may be detected by the magnetic sensor. Therefore, continuity failures due to abrasion with time, oxidation, etc., which have been a problem in detection mechanisms having a structure in which a slider is caused to slide along a conductive pattern, can be suppressed. Accordingly, the operation opposition of the rotating knob can be reliably detected for a long time.

The lever operation device according to Japanese Unexamined Patent Application Publication No. 2009-224057 includes a magnetic detection mechanism in which the permanent magnet is moved or rotated in response to the rotation of the rotating knob. However, when the permanent magnet is moved along an arc or a straight line in response to the rotation of the permanent magnet, the permanent magnet cannot be rotated while the permanent magnet is near the magnetic sensor. In the case where the permanent magnet is configured to rotate while the permanent magnet is near the magnetic sensor, a ring gear portion that rotates together with the rotating knob and a driving gear externally mounted on a shaft portion of a holder placed in the operation lever are arranged so as to directly mesh with each other. Since there is a limit to how small the diameter of the driving gear can be set with respect to the diameter of the ring gear portion, the speed-increasing ratio of the driving gear to which the permanent magnet is fixed cannot be set to a large value. Therefore, it is difficult to rotate the permanent magnet by a large amount in response to the rotation of the rotating knob. Therefore, in the structure of the related art, there has been a problem in that it is difficult to accurately detect the operation position of the rotating knob at a high resolution and the detection resolution is low.

SUMMARY OF THE INVENTION

In view of the above-described circumstances of the related art, the present invention provides a lever operation device capable of accurately detecting the operation position of the rotating knob at a high resolution.

According to an aspect of the present invention, a lever operation device includes a rotating knob attached to an outer peripheral portion of a cylindrical operation lever such that the rotating knob is rotatable along a circumferential direction of the outer peripheral portion; a circuit board disposed in the operation lever so as to extend along an axial direction of the operation lever; a magnetic sensor mounted on the circuit board; a transmission gear driven by the rotating knob so as to rotate in a plane parallel to the circuit board; a speed-increasing gear driven by the transmission gear so as to rotate in the plane parallel to the circuit board at an increased speed; and a permanent magnet fixed to the speed-increasing gear and opposed to the magnetic sensor at a position close thereto. A lead thread portion provided on the inner peripheral surface of the rotating knob rotates the speed-increasing gear by rotating the transmission gear, so that the permanent magnet rotates with respect to the magnetic sensor.

In the lever operation device having the above-described structure, the rotational direction of the transmission gear can be changed to the direction along the circuit board. In addition, by appropriately setting the pitch of the lead thread portion and the transmission gear and the number of teeth of the speed-increasing gear, the settable range of the speed-increasing ratio of the speed-increasing gear with respect to the rotating knob can be increased. Accordingly, the speed-increasing gears can be rotated at a high speed. Thus, the permanent magnet fixed to the speed-increasing gear is rotated while the gap between the permanent magnet and the magnetic sensor is maintained at a constant distance. In addition, the rotational angle of the transmission gear that is rotated by the rotation of the rotating knob is increased so that the permanent magnet is rotated by a very large rotational angle while the permanent magnet faces the magnetic sensor at a position close thereto. Therefore, a large variation in magnetic field caused by the rotation of the permanent magnet can be detected by the detection sensor, and the operation position of the rotating knob can be accurately detected at a high resolution.

In the above-described structure, a switch unit may be formed of a casing in which the circuit board, the speed-increasing gear, and the transmission gear are positioned and retained, the switch unit being installed in the operation lever. In such a case, the switch unit in which the power transmitting means and the detecting means for the rotating knob are combined as a unit can be assembled to the operation lever. Thus, the assembly efficiency can be increased. In this case, the lever operation device may further include one or more operation members arranged on the outer peripheral portion or an end portion of the operation lever at positions different from a position of the rotating knob; and one or more detecting means for detecting operations of the one or more operation members individually, and the one or more detecting means may be disposed in the switch unit. Since the plurality of detecting means for the plurality of types of operation members (operations knobs) including the rotating knob are combined as a unit, a lever operation device having high assembly efficiency and high functionality can be provided. With regard to the operation members other than the rotating knob, the detecting means of each operation member may include a magnetic sensor mounted on the circuit board, a rotating body rotated by the operation member, and a permanent magnet fixed to the rotating body and opposed to the magnetic sensor at a position close thereto. In this case, magnetic sensors having the same characteristics and permanent magnets having the same characteristics may be used in all of the plurality of detecting means disposed in the switch unit. Thus, the lever operation device can be easily designed, and the detection accuracy and cost efficiency thereof can be easily increased.

In the above-described structure, the transmission gear may be a ring gear having external teeth that mesh with the lead thread portion of the rotating knob and internal teeth that mesh with a plurality of speed-increasing gears, and the permanent magnet may be fixed to at least one of the speed-increasing gears. In this case, the structure of the power transmitting means for the rotating knob can be made simpler.

In addition, in the above-described structure, the transmission gear may be a ring gear having external teeth that mesh with the lead thread portion of the rotating knob and internal teeth that mesh with a plurality relay speed-increasing gears, and the speed-increasing gear may mesh with the plurality of relay speed-increasing gears. In this case, the structure of the power transmitting means for the rotating knob can be made simpler, and a lever operation device having high signal reliability can be provided.

In the lever operation device according to the embodiments of the present invention, when the rotating knob is rotated, the speed-increasing gear is rotated at an increased speed by the rotation of the transmission gear. Accordingly, the permanent magnet fixed to the speed-increasing gear rotates while facing the magnetic sensor at a position close thereto. Thus, the operation position of the rotating knob can be detected extremely accurately by detecting a very large variation in magnetic field caused by the rotation of the permanent magnet with the magnetic sensor.

DESCRIPTION OF THE PREFERRED EMBODIMENT

Figure 1:
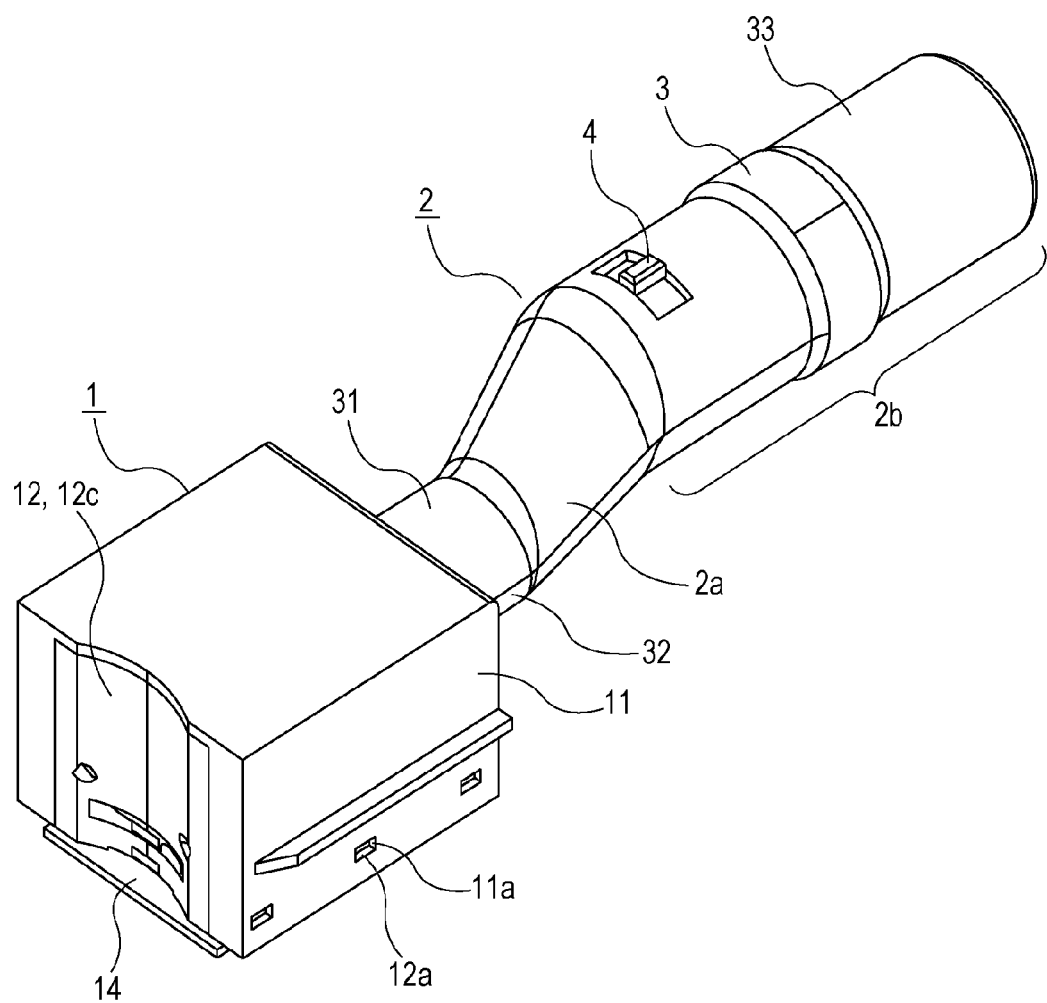
FIG. 1 is a perspective view of a lever operation device according to a first embodiment of the present invention.

Embodiments of the present invention will now be described below. First, a lever operation device according to a first embodiment of the present invention will be described with reference to FIGS. 1 to 15. The lever operation device is used as a turn signal switch device of an automobile. Referring to FIG. 1, the lever operation device includes a housing 1 fixed to, for example, a steering column (not shown) and an operation lever 2 that projects from the housing 1. The operation lever 2 can be pivoted along two orthogonal operation planes (first and second operation planes), and can be selectively operated along the individual operation planes. A plurality of operation members, such as a rotating knob 3 and a slide knob 4, are provided on the outer periphery of the operation lever 2. The operation members can be operated individually.

Figure 2:
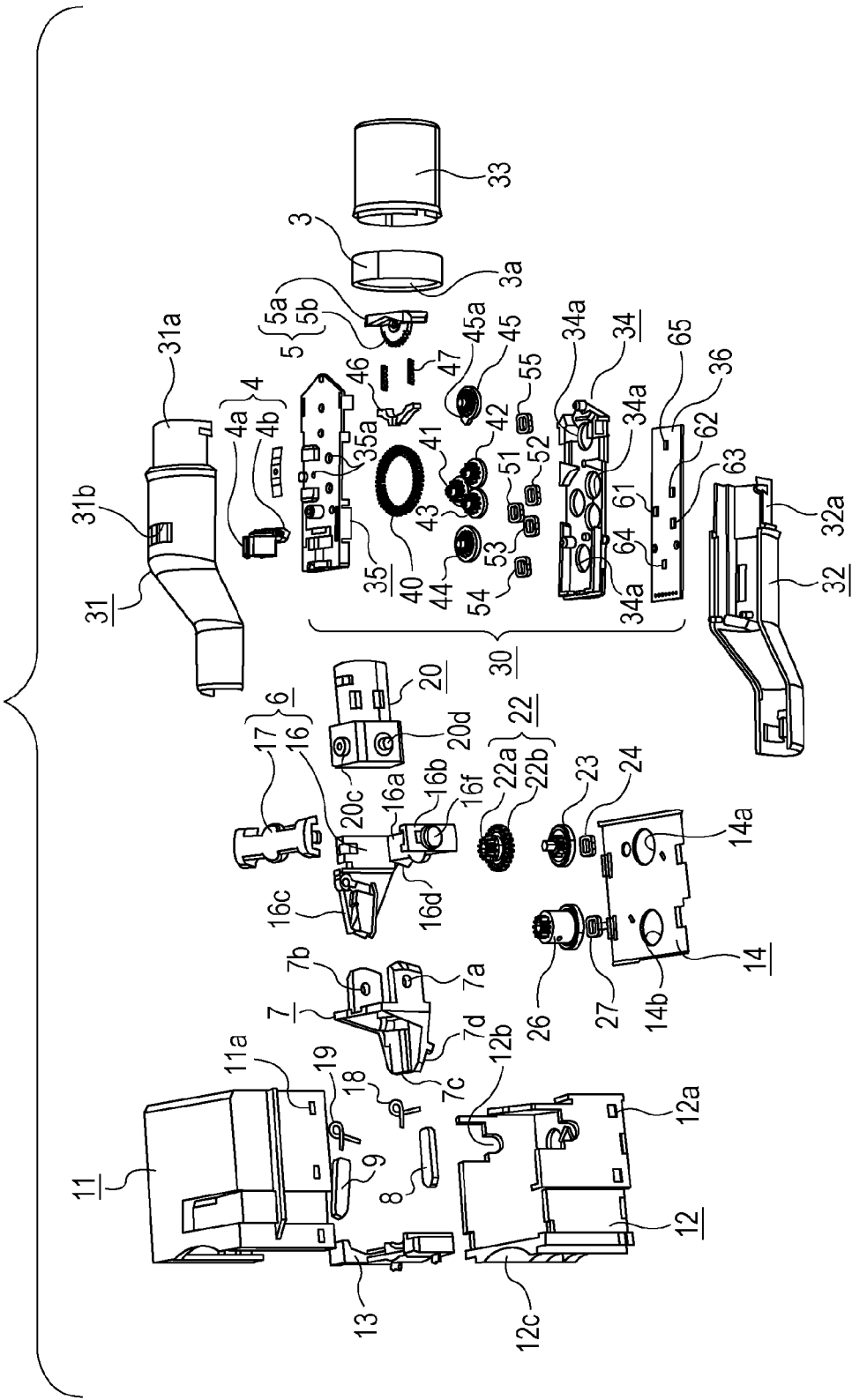
FIG. 2 is an exploded perspective view of the lever operation device illustrated in FIG. 1.
Figure 3:
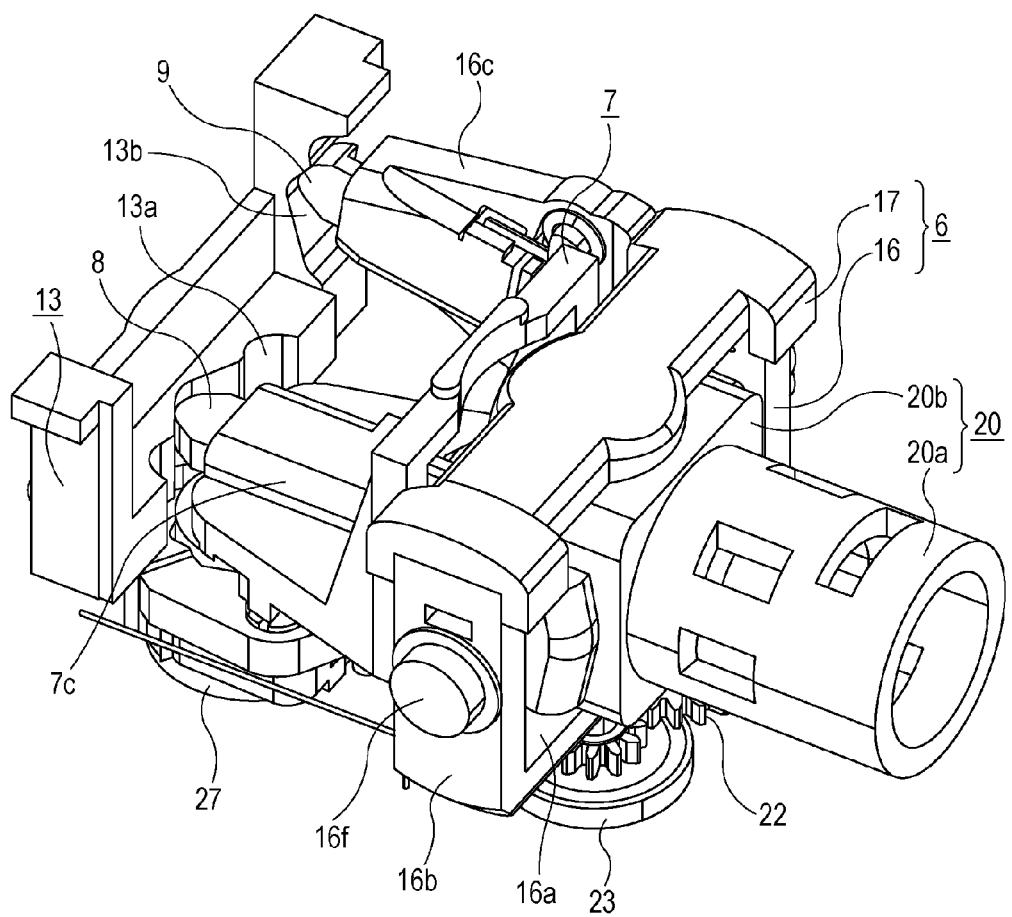
FIG. 3 is a perspective view of a support mechanism that supports a base portion of an operation lever according to the first embodiment.
Figure 5:
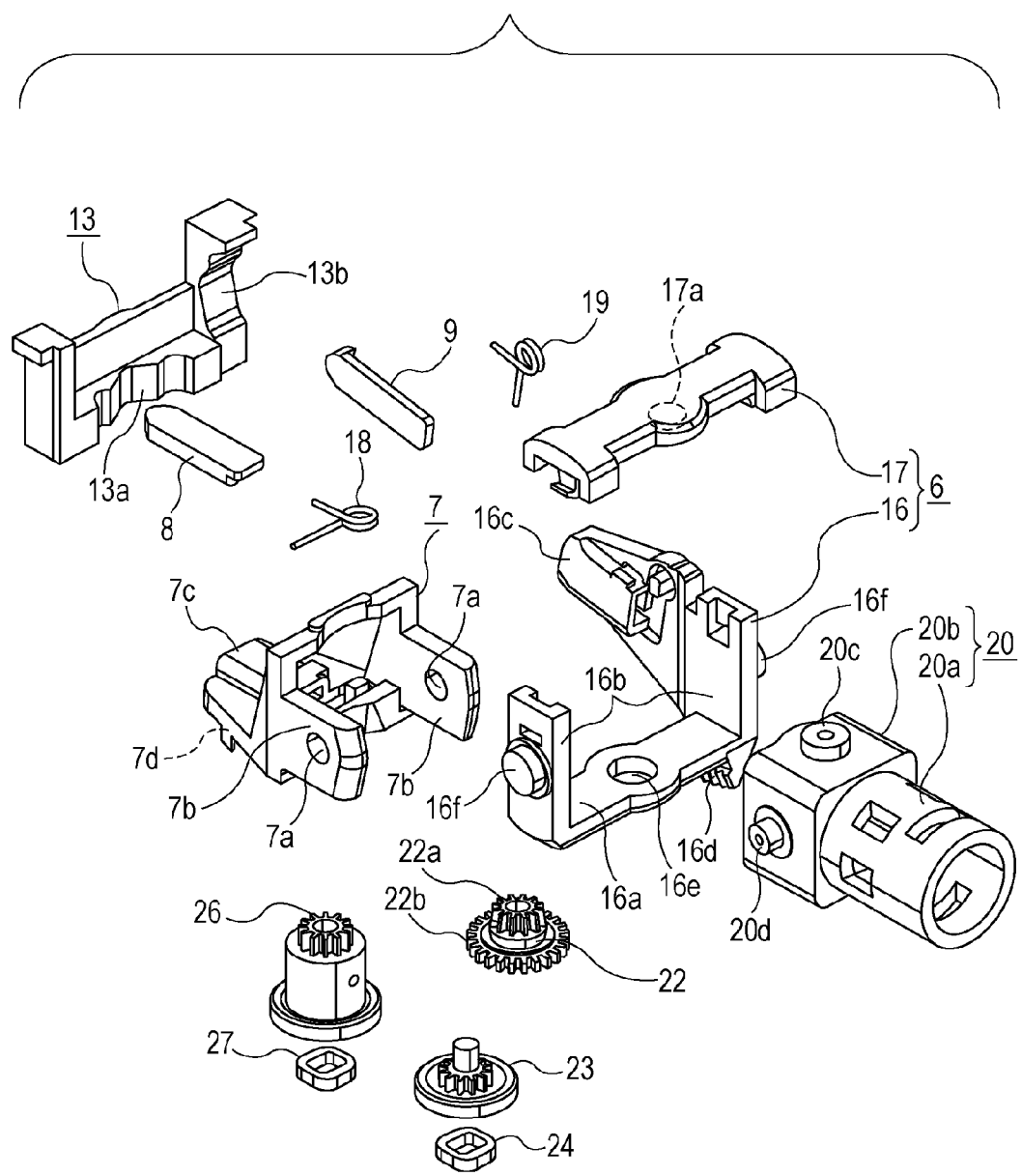
FIG. 5 is an exploded perspective view of the support mechanism illustrated in FIG. 3.
Figure 12:
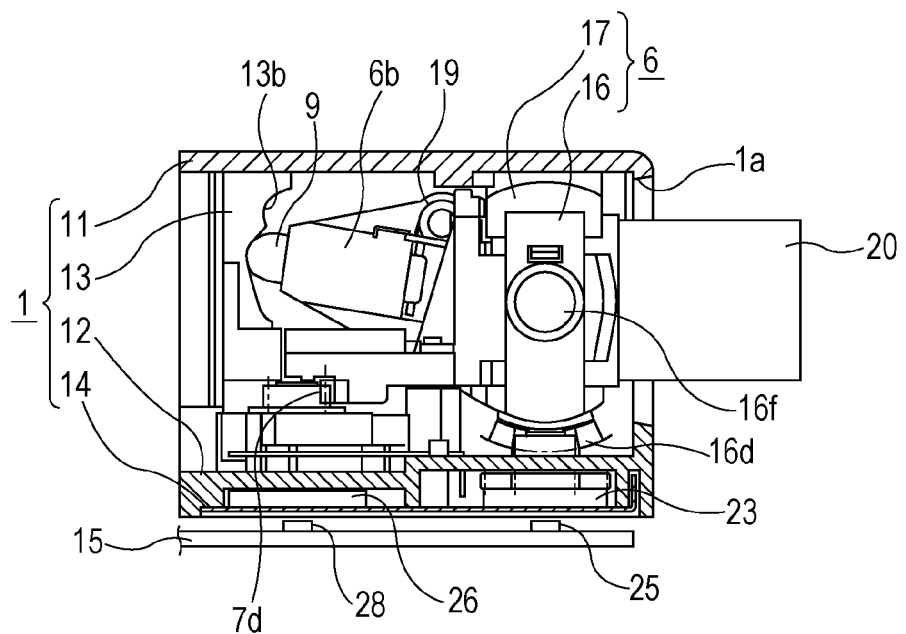
FIG. 12 is a diagram illustrating an engagement state of a second actuator when the operation lever is at a neutral position according to the first embodiment.
Figure 13:
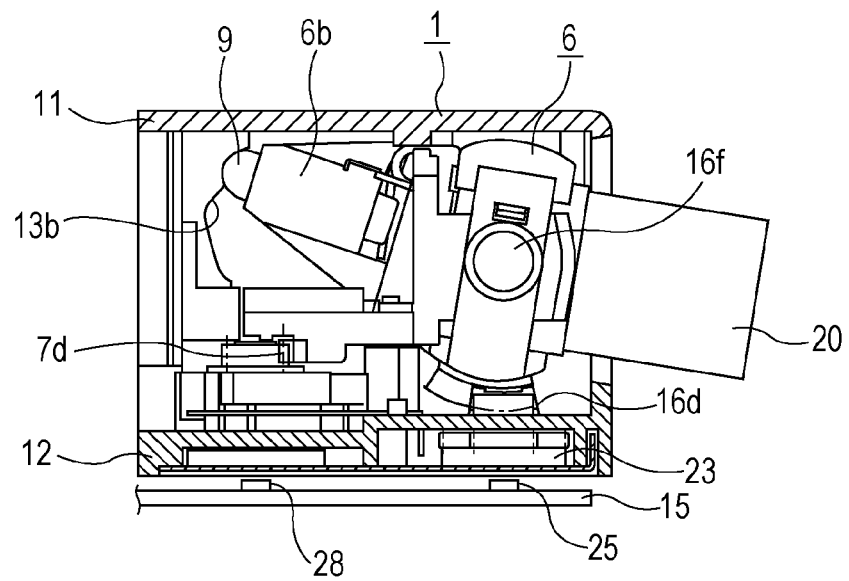
FIG. 13 is a diagram illustrating an engagement state of the second actuator when the operation lever is operated clockwise in FIG. 12.
Figure 14:
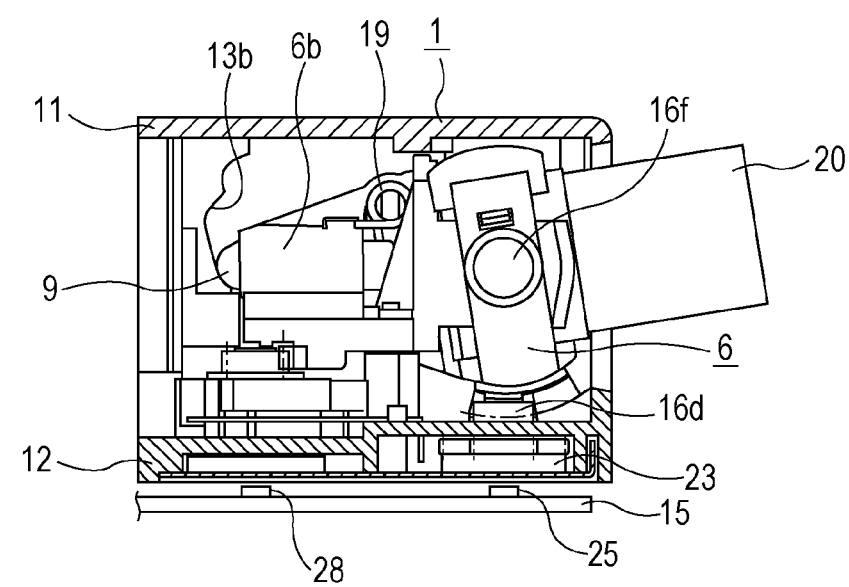
FIG. 14 is a diagram illustrating an engagement state of the second actuator when the operation lever is operated counterclockwise in FIG. 12.

The housing 1 is a box-shaped body formed by combining together an upper case 11, a lower case 12, a cam plate 13, and a bottom plate 14, which are illustrated in FIG. 2. The upper case 11 and the lower case 12 are snap-fitted together by fitting engagement claws 12a provided on the lower case 12 to engagement holes 11a formed in the upper case 11, so that an opening at the top of the lower case 12 is covered by the upper case 11. U-shaped cut sections 12b are formed in side wall portions of the lower case 12 at positions where the cut sections 12b are opposed to each other. The cut sections 12b function as bearing portions and support supporting shafts 16f of a movable support member 6, which will be described below, together with parts of inner walls (not shown) of the upper case 11 such that the supporting shafts 16f are rotatable. The cam plate 13 is fixed to an inner surface of a back wall portion 12c of the lower case 12. As illustrated in FIG. 5, the cam plate 13 is provided with a first cam surface 13a and a second cam surface 13b at different positions such that directions in which crests and troughs are arranged in the first and second cam surfaces 13a and 13b cross each other. The cam surfaces 13a and 13b define parts of an inner wall surface of the housing 1. An opening 1a (see FIGS. 9 and 12) is formed at a side of the housing 1 that is opposite to the back wall portion 12c when the upper case 11 and the lower case 12 are combined together. The operation lever 2 projects outward through the opening 1a. The bottom plate 14 is fixed to the lower case 12 so as to cover an opening at the bottom of the lower case 12. The bottom plate 14 has attachment holes 14a and 14b for attaching detection gears 23 and 26, which will be described below, at predetermined positions. As illustrated in FIGS. 12 to 14, a circuit board 15 is located near and parallel to the bottom plate 14, and magnetic sensors 25 and 28 are mounted on the circuit board 15.

A base portion 20 having a hollow structure, which is integrated with the operation lever 2, is disposed in the housing 1. The base portion 20 supports a base end portion of the operation lever 2, and is supported such that the base portion 20 is pivotable along two orthogonal directions by the structure illustrated in FIGS. 1 to 5. Referring to FIG. 5, the base portion 20 includes a cylindrical portion 20a to which the operation lever 2 is fitted; a rectangular-tube-shaped portion 20b that continues from the cylindrical portion 20a; a pair of first shafts 20c that project outward from two opposing walls of the rectangular-tube-shaped portion 20b; and a pair of second shafts 20d that project outward from the other two opposing walls of the rectangular-tube-shaped portion 20b. The axial center of the first shafts 20c and the axial center of the second shafts 20d are orthogonal to each other.

The operation lever 2 is supported such that the operation lever 2 is pivotable in two orthogonal directions by the movable support member 6, the bearing portions (cut sections 12b) of the housing 1, an actuator holder 7, a first actuator 8, and a second actuator 9. The movable support member 6 supports the base portion 20 of the operation lever 2 such that the base portion 20 is rotatable along a first operation plane P1 (plane orthogonal to the axial center of the first shafts 20c). The bearing portions support the movable support member 6 such that the movable support member 6 is rotatable along a second operation plane P2 that is orthogonal to the first operation plane P1 (plane orthogonal to the axial center of the supporting shafts 16f). The actuator holder 7 is attached to the base portion 20 such that the actuator holder 7 is pivotable along the second operation plane P2. The first actuator 8 is retained by the actuator holder 7 with a torsion spring (first elastic urging means) 18 provided therebetween. The second actuator 9 is retained by the movable support member 6 with a torsion spring (second elastic urging means) 19 provided therebetween. When the operation lever 2 is operated along the first operation plane P1, the movable support member 6 does not move. However, the actuator holder 7 rotates together with the base portion 20 along the first operation plane P1, so that only the first actuator 8 slides along the first cam surface 13a. When the operation lever 2 is operated along the second operation plane P2, the actuator holder 7 does not move, as described below. However, the movable support member 6 rotates together with the base portion 20 along the second operation plane P2, so that only the second actuator 9 slides along the second cam surface 13b. The first operation plane P1 is a plane that extends along the bottom plate 14 and the plane of FIGS. 9 to 11, and the second operation plane P2 is a plane that extends along the side wall portions of the housing 1 and the plane of FIGS. 12 to 14.

Figure 4:
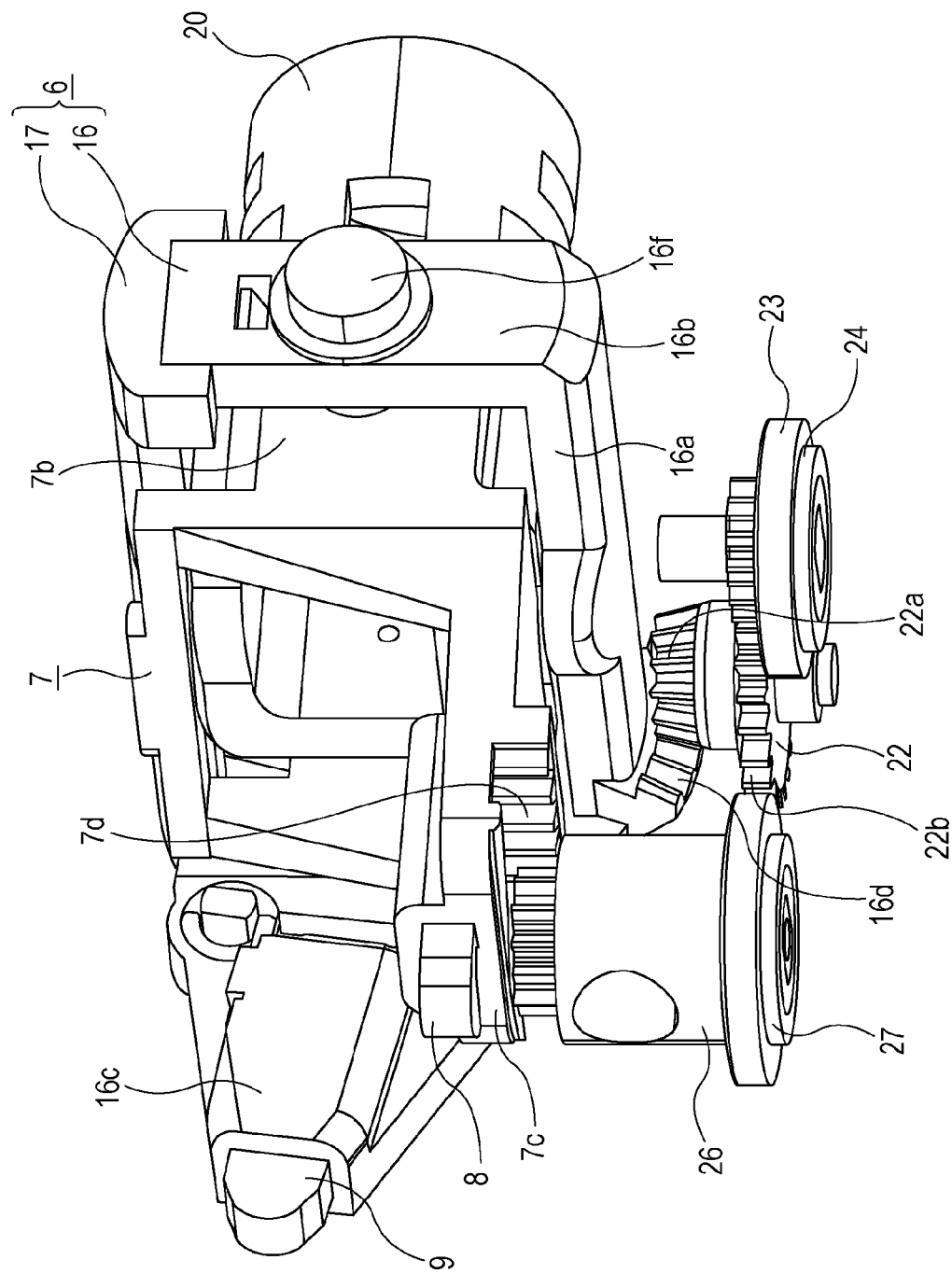
FIG. 4 is a perspective view of the support mechanism illustrated in FIG. 3 viewed from below.

The movable support member 6 is a hollow frame body formed by snap-fitting a base member 16 and a bridging plate 17 together. As illustrated in FIG. 5, the base member 16 includes a bottom portion 16a; a pair of side wall portions 16b that project in the same direction from the ends of the bottom portion 16a; an actuator-retaining portion (second retaining portion) 16c that projects toward the second cam surface 13b of the cam plate 13 from one of the side wall portions 16b; and a gear portion 16d that meshes with a relay gear 22 at the bottom side of the bottom portion 16a. A pair of bearing recesses 16e and 17a that support the pair of first shafts 20c on the base portion 20 in a rotatable manner are formed in the opposing surfaces of the bottom portion 16a and the bridging plate 17, respectively. The pair of supporting shafts 16f are formed so as to project outward from the outer surfaces of the side wall portions 16b, and are rotatably supported by the bearing portions (cut sections 12b) of the housing 1. The supporting shafts 16f serve as rotating shafts of the movable support member 6 with respect to the housing 1. The movable support member 6 attached to the housing 1 is rotatable around the axial center of the supporting shafts 16f along the second operation plane P2. The axial center of the supporting shafts 16f coincides with the axial center of the second shafts 20d on the base portion 20. The base portion 20 and the movable support member 6 can rotate together along the second operation plane P2 with the supporting shafts 16f serving as the rotating shafts. However, when the base portion 20 rotates along the first operation plane P1 with the first shafts 20c serving as the rotating shafts, the movable support member 6 does not rotate together with the base portion 20. The torsion spring 19 and the second actuator 9 are assembled to and retained by the actuator-retaining portion 16c. The second actuator 9 receives an urging force from the torsion spring 19 so that the second actuator 9 is constantly in elastic contact with the second cam surface 13b. As illustrated in FIG. 4, the gear portion 16d is formed as a part of a bevel gear. The gear portion 16d meshes with a small-diameter portion 22a of the relay gear 22, which is rotatable along the bottom plate 14, that is, rotatable such that the rotational axis of the relay gear 22 is orthogonal to the bottom plate 14. The detection gear 23, which is also rotatable along the bottom plate 14, meshes with a large-diameter portion 22b of the relay gear 22. Therefore, the gear portion 16d can rotate the detection gear 23 by rotating the relay gear 22 provided therebetween. More specifically, when the movable support member 6 rotates around the supporting shafts 16f, the rotational driving force is transmitted from the gear portion 16d to the relay gear 22, and the rotational direction is converted into a direction orthogonal thereto. Then, the relay gear 22 rotates the detection gear 23 at an increased rotational speed.

The relay gear 22 and the detection gear 23 are rotatably supported on the bottom plate 14 of the housing 1. A permanent magnet 24 is fixed to the bottom surface of the detection gear 23. The attachment position of the detection gear 23 is regulated by the attachment hole 14a in the bottom plate 14 such that the permanent magnet 24 faces the magnetic sensor 25 on the circuit board 15 at a position close thereto. A variation in magnetic field caused by a variation in the rotational position of the permanent magnet 24, which rotates together with the detection gear 23, is detected by the magnetic sensor 25. Thus, the rotational position of the movable support member 6, in other words, the operation position of the operation lever 2 along the second operation plane P2, can be accurately detected. The relay gear 22 is provided between the gear portion 16d and the detection gear 23 due to the following reason. That is, if the detection gear 23 and the gear portion 16d are configured so as to directly mesh with each other, an angular range within which the detection gear 23 can be rotated in response to the operation of the operation lever 2 would be extremely small compared to the maximum detection angular range of the magnetic sensor 25. To avoid this, the relay gear 22 is provided between the gear portion 16d and the detection gear 23 so as to increase the angular range of the detection gear 23 to a range close to the maximum detection angular range of the magnetic sensor 25, thereby allowing high-accuracy detection of the operation position of the operation lever 2 along the second operation plane P2.

As illustrated in FIG. 5, the actuator holder 7 includes a pair of attachment wall portions 7b which face each other and which each have a shaft hole 7a; an actuator-retaining portion (first retaining portion) 7c that projects in a direction opposite to the attachment wall portions 7b; and a gear portion 7d that meshes with the detection gear 26 at the bottom side of the retaining portion 7c. The shaft holes 7a in the attachment wall portions 7b receive the second shafts 20d on the base portion 20 in a rotatable manner. Thus, the actuator holder 7 is attached to the base portion 20 such that the actuator holder 7 is rotatable around the axial center of the second shafts 20d. In addition, the first actuator 8, which is constantly in elastic contact with the first cam surface 13a, receives a reaction force generated by the urging force of the torsion spring 18 from the first cam surface 13a and is restrained from sliding along the first cam surface 13a. Therefore, when the base portion 20 rotates along the second operation plane P2 with the supporting shafts 16f serving as the rotating shafts, the actuator holder 7 does not rotate together with the base portion 20. Instead, the movable support member 6 rotates along the second operation plane P2 together with the base portion 20, so that only the second actuator 9 slides along the second cam surface 13b. The actuator holder 7 rotates together with the base portion 20 only when the base portion 20 rotates along the first operation plane P1 with the first shafts 20c serving as the rotating shafts. The torsion spring 18 and the first actuator 8 are assembled to and retained by the actuator retaining portion 7c. The first actuator 8 receives the urging force from the torsion spring 18 so that the first actuator 8 is constantly in elastic contact with the first cam surface 13a. The gear portion 7d meshes with the detection gear 26 that is rotatable along the bottom plate 14. When the actuator holder 7 rotates along the first operation plane P1 together with the base portion 20, the rotational driving force is transmitted from the gear portion 7d to the detection gear 26, so that the detection gear 26 is rotated.

The detection gear 26 is supported on the bottom plate 14 of the housing 1, and a permanent magnet 27 is fixed to the bottom surface of the detection gear 26. The attachment position of the detection gear 26 is regulated by the attachment hole 14b in the bottom plate 14 such that the permanent magnet 27 faces the magnetic sensor 28 on the circuit board 15 at a position close thereto. A variation in magnetic field caused by a variation in the rotational position of the permanent magnet 27 which rotates together with the detection gear 26 is detected by the magnetic sensor 28. Thus, the rotational position of the actuator holder 7, in other words, the operation position of the operation lever 2 along the first operation plane P1, can be accurately detected.

Next, the operation lever 2, the internal structure thereof, and the operation members, such as the rotating knob 3, provided on the outer periphery of the operation lever 2 will be described. The operation lever 2 includes a pair of semicylindrical bodies 31 and 32 that are integrated with the base portion 20 and a cylindrical end cover 33 that is integrated with a distal end portion of a cylindrical body formed by combining the semicylindrical bodies 31 and 32. In the present embodiment, the semicylindrical bodies 31 and 32 are snap-fitted together, and the end cover 33 is snap-fitted to the semicylindrical bodies 31 and 32. The semicylindrical bodies 31 and 32 are bent at an intermediate position thereof. Accordingly, as illustrated in FIG. 1, the operation lever 2 has a cylindrical shape that includes a bent portion 2a and projects outward from the base portion 20.

Figure 7:
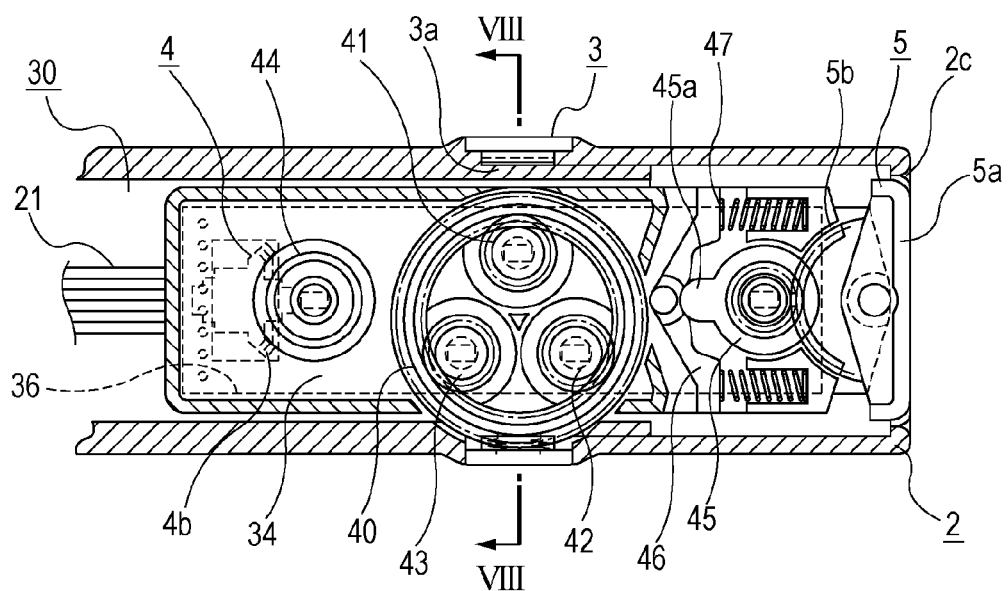
FIG. 7 is a diagram illustrating the internal structure of a distal end section of the operation lever according to the first embodiment.
Figure 8:
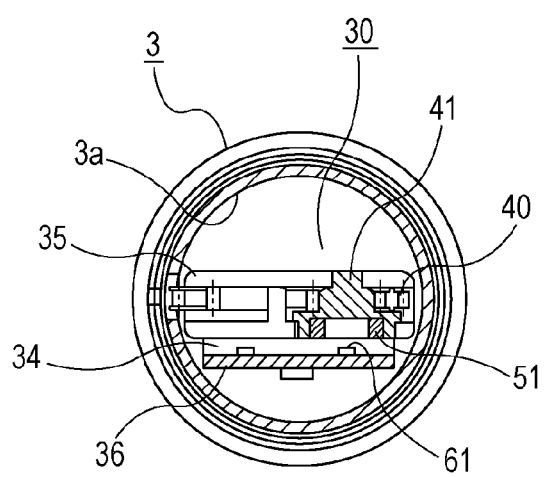
FIG. 8 is a sectional view of FIG. 7 taken along line VIII-VIII.

The operation lever 2 includes a substantially cylindrical portion 2b at the distal-end side of the bent portion 2a. The rotating knob 3 and the slide knob 4 are provided on the periphery of the substantially cylindrical portion 2b, and a locker knob 5 (see FIG. 7) is provided at the distal end of the substantially cylindrical portion 2b. A switch unit 30 is disposed in the substantially cylindrical portion 2b so as to extend in an axial direction thereof. As illustrated in FIG. 2, the switch unit 30 mainly includes a casing formed by combining a support case 34 and a cover case 35 together such that the support case 34 and the cover case 35 face each other; components such as gears 40 to 45, a cam lever 46, and coil springs 47 arranged in the casing; and a circuit board 36 provided so as to face the bottom surface of the support case 34. The switch unit 30 is disposed in the operation lever 2 such that the cases 34 and 35 and the circuit board 36 extend in the axial direction of the substantially cylindrical portion 2b. As illustrated in FIG. 7, a flat cable 21 is connected to the circuit board 36 and extends through the operation lever 2 to the inside of the housing 1.

The gear 40 is a ring gear having a large diameter, and the gears 41 to 43 are speed-increasing gears that mesh with the ring gear 40. The four gears 40 to 43 are arranged to serve as power transmitting means for the rotating knob 3. The gear 44 is arranged to serve as power transmitting means for the slide knob 4, and the gear 45, which is provided with an operating portion 45a, is arranged to serve as power transmitting means for the locker knob 5. Permanent magnets 51 to 55 are fixed to the bottom surfaces of the gears 41 to 45 excluding the ring gear 40. The permanent magnets 51 to 55 respectively face magnetic sensors 61 to 65 mounted on the circuit board 36 at positions close thereto. The support case 34 has a plurality of attachment holes 34a for attaching the gears 41 to 45 at predetermined positions, and the cover case 35 has a plurality of bearing holes 35a for supporting the shafts of the gears 41 to 45. The gears 41 to 45 are supported such that the gears 41 to 45 are rotatable along the circuit board 36, in other words, such that the rotational axes of the gears 41 to 45 are orthogonal to the circuit board 36. The ring gear 40 that meshes with the gears 41 to 43 so as to surround the gears 41 to 43 is also supported such that the gear 40 is rotatable along the circuit board 36.

Figure 6:
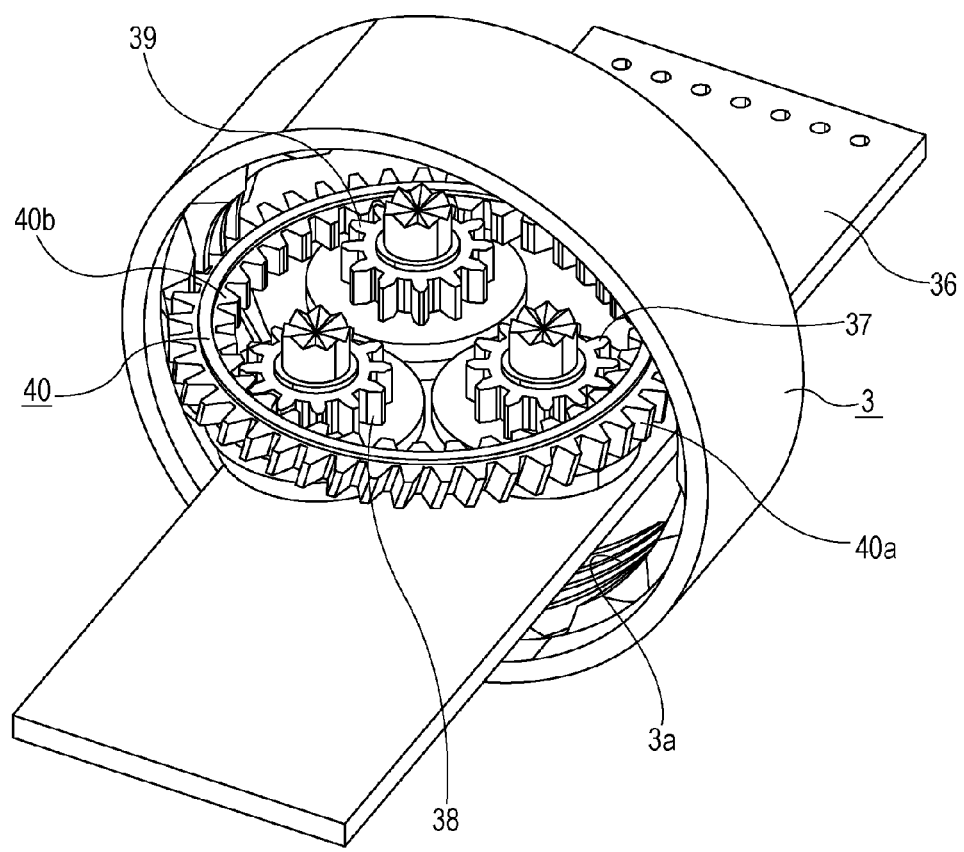
FIG. 6 is a perspective view of power transmitting means for a rotating knob according to the first embodiment.

The rotating knob 3 is externally fitted to stepped portions 31a and 32a formed on the semicylindrical bodies 31 and 32, respectively, and is supported such that the rotating knob 3 is rotatable within a predetermined angular range. Referring to FIG. 6, multiple lead portions 3a defined by a plurality of lead grooves are formed on the inner periphery of the rotating knob 3. The multiple lead portions 3a are formed as a lead thread portion for rotating the ring gear 40, and function as a worm gear when the rotating knob 3 is rotated. The multiple lead portions 3a on the rotating knob 3 mesh with external teeth 40a on the outer periphery of the ring gear 40. The plane orthogonal to the rotational axis of the rotating knob 3 and the plane orthogonal to the rotational axis of the ring gear 40 are orthogonal to each other. When the rotating knob 3 is rotated, the driving force is transmitted to the ring gear 40 while the rotational direction is changed to a direction orthogonal thereto. The ring gear 40 may be rotated by a desired rotational angle by appropriately setting the lead angle of the lead grooves. Internal teeth 40b that mesh with the speed-increasing gears 41 to 43 are provided on the inner periphery of the ring gear 40. When the ring gear 40 rotates, the speed-increasing gears 41 to 43 are driven so as to rotate in the same direction, so that the permanent magnets 51 to 53 also rotate together with the speed-increasing gears 41 to 43, respectively. Variations in magnetic fields caused by variations in the rotational positions of the permanent magnets 51 to 53 can be accurately detected by the magnetic sensors 61 to 63. The attachment positions of the speed-increasing gears 41 to 43 are defined by the corresponding attachment holes 34a in the support case 34. In the present embodiment, the three speed-increasing gears 41 to 43 are arranged along the inner periphery of the ring gear 40 with constant intervals therebetween, and have the same characteristics. The permanent magnets 51 to 53 fixed to the speed-increasing gears 41 to 43, respectively, also have the same magnetic characteristics. The magnetic sensors 61 to 63 that face the permanent magnets 51 to 53, respectively, at positions close thereto also have the same detection characteristics.

The slide knob 4 includes an operating portion 4a exposed at an opening 31b formed in the semicylindrical body 31, and is pivotally supported on the cover case 35 such that the operating portion 4a is slidable along the circumferential direction of the semicylindrical body 31. A gear portion 4b, which is a part of a bevel gear, is provided at one side of the slide knob 4. The gear portion 4b meshes with the gear 44, which is a detection gear. When the slide knob 4 is slid, the gear 44 is driven by the gear portion 4b so as to rotate along the circuit board 36, so that the permanent magnet 54 rotates together with the gear 44. A variation in magnetic field caused by a variation in the rotational position of the permanent magnet 54 can be accurately detected by the magnetic sensor 64. The attachment position of the gear 44 is regulated by the corresponding attachment hole 34a in the support case 34. In the present embodiment, the permanent magnet 54 have the same magnetic characteristics as those of the permanent magnets 51 to 53, and the magnetic sensor 64 have the same detection characteristics as those of the magnetic sensors 61 to 63.

The locker knob 5 includes an operating portion 5a exposed at an opening 2c (see FIG. 7) formed in the semicylindrical bodies 31 and 32 at the distal end thereof. The locker knob 5 is pivotally supported by distal end portions of the cases 34 and 35 such that the ends of the operating portion 5a in the longitudinal direction thereof can be selectively pressed toward the inside of the operation lever 2. A gear portion 5b is provided at the back side of the operating portion 5a of the locker knob 5, and the gear portion 5b meshes with the gear 45, which is a detection gear. When the ends of the locker knob 5 are selectively pressed, the gear 45 rotates together with the permanent magnet 55. A variation in magnetic field caused by a variation in the rotational position of the permanent magnet 55 can be accurately detected by the magnetic sensor 65. The gear 45 is provided with an operating portion 45a, and a clicking sensation is generated when the operating portion 45a moves over a crest of the cam surface of the cam lever 46. The cam lever 46 is rotatably retained by the cases 34 and 35, and the pair of coil springs 47 are interposed between the cam lever 46 and the locker knob 5. When the locker knob 5 is pressed, the locker knob 5 is caused to automatically return to the original position by the cam lever 46 and the coil springs 47. The attachment position of the gear 45 is regulated by the corresponding attachment hole 34a in the support case 34. In the present embodiment, the permanent magnet 55 have the same magnetic characteristics as those of the permanent magnets 51 to 54, and the magnetic sensor 65 have the same detection characteristics as those of the magnetic sensors 61 to 64.

In the present embodiment, annular magnets magnetized to N and S poles that are separated from each other by 180 degrees are used as the permanent magnets 24, 27, and 51 to 55, and giant magnetoresistive (GMR) sensors are used as the magnetic sensors 25, 28, and 61 to 65. However, the shapes and magnetization directions of the permanent magnets can be selected as appropriate, and MRE sensors, Hall elements, etc., may be used as the magnetic sensors.

Figure 9:
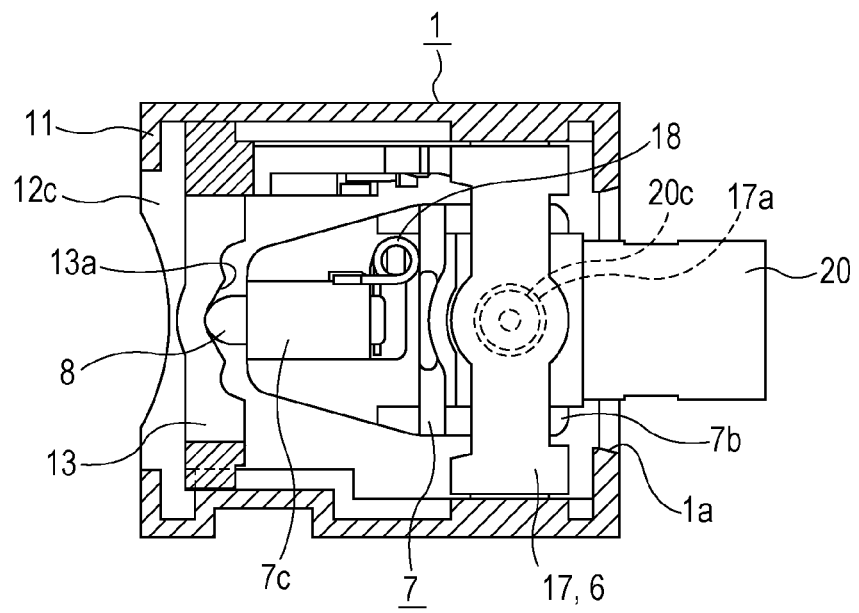
FIG. 9 is a diagram illustrating an engagement state of a first actuator when the operation lever is at a neutral position according to the first embodiment.
Figure 10:
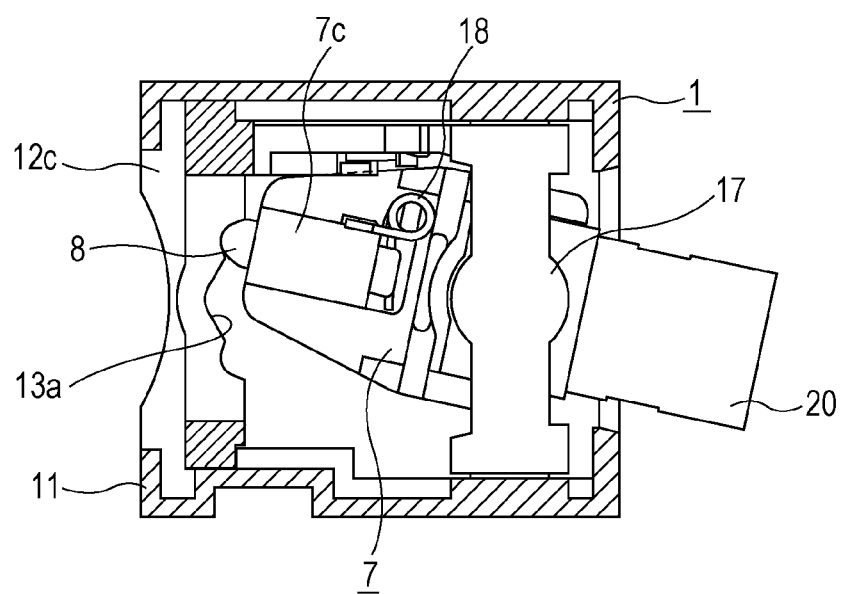
FIG. 10 is a diagram illustrating an engagement state of the first actuator when the operation lever is operated clockwise in FIG. 9.
Figure 11:
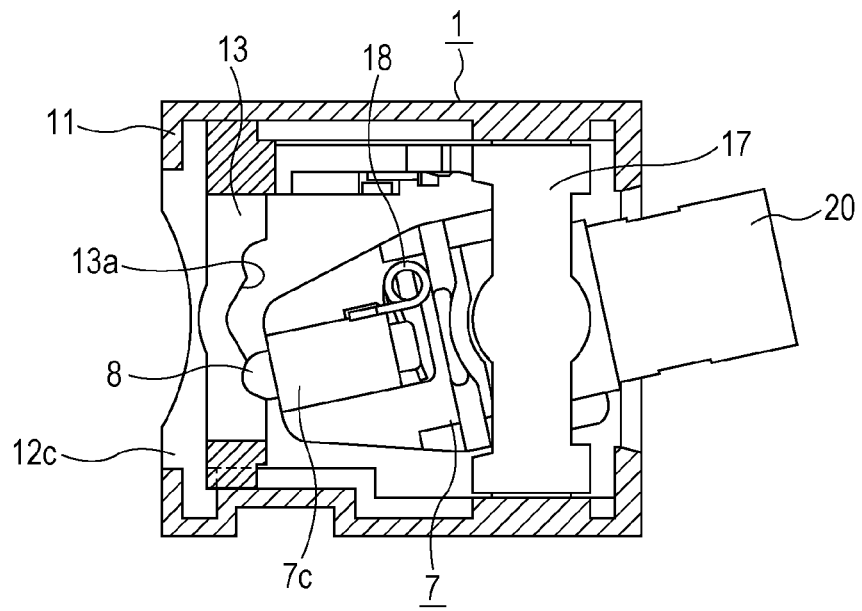
FIG. 11 is a diagram illustrating an engagement state of the first actuator when the operation lever is operated counterclockwise in FIG. 9.

The operation of the lever operation device having the above-described structure will now be described. First, the operation of the operation lever 2 will be described. FIGS. 9 and 12 illustrate the state in which the operation lever 2 is not pivoted in either direction and is retained at a neutral position. In this state, the first actuator 8 that is urged by the torsion spring 18 is in elastic contact with a trough of the first cam surface 13a, so that the actuator holder 7 is stably retained. In addition, the second actuator 9 that is urged by the torsion spring 19 is in elastic contact with a trough of the second cam surface 13b, so that the movable support member 6 is also stably retained.

When the operation lever 2 is pivoted from this state along the first operation plane P1, which is parallel to the plane of FIG. 9, the movable support member 6 does not move together with the base portion 20 of the operation lever 2, so that the second actuator 9 retained by the movable support member 6 does not slide along the second cam surface 13b. Accordingly, only the first actuator 8 retained by the actuator holder 7, which moves together with the base portion 20 of the operation lever 2, slides along the first cam surface 13a. Thus, the actuator holder 7 rotates together with the base portion 20, so that the first actuator 8 slides along the first cam surface 13a and the gear portion 7d rotates the detection gear 26. When the operation lever 2 is pivoted clockwise in FIG. 9, the first actuator 8 generates a clicking sensation by moving over one of the crests of the first cam surface 13a, and is restrained at an end of the first cam surface 13a immediately after the generation of the clicking sensation. Thus, the actuator holder 7 and the base portion 20 rotate to the position illustrated in FIG. 10, and are stopped. When the operation lever 2 is pivoted counterclockwise in FIG. 9, the first actuator 8 generates a clicking sensation by moving over the other one of the crests of the first cam surface 13a, and is restrained at the other end of the first cam surface 13a immediately after the generation of the clicking sensation. Thus, the actuator holder 7 and the base portion 20 rotate to the position illustrated in FIG. 11, and are stopped. In response to the rotation of the actuator holder 7 and the base portion 20, the detection gear 26 is rotated in a certain rotational direction by a certain amount. The variation in magnetic field caused by the variation in the rotational position of the permanent magnet 27 fixed to the detection gear 26 is detected by the magnetic sensor 28 (see FIGS. 12 to 14), so that the operation position of the operation lever 2 along the first operation plane P1 can be accurately detected. Accordingly, when the operation lever 2 is pivoted to the position illustrated in FIG. 10, a switch for flashing a right-turn lamp can be turned on in response to a detection signal output from the magnetic sensor 28. Similarly, when the operation lever 2 is pivoted to the position illustrated in FIG. 11, a switch for flashing a left-turn lamp can be turned on in response to a detection signal output from the magnetic sensor 28.

If the operation lever 2 retained at the neutral position is pivoted along the second operation plane P2, which is parallel to the plane of FIG. 12, the movable support member 6 rotates together with the base portion 20. Accordingly, the second actuator 9 slides along the second cam surface 13b, and the gear portion 16d rotates the detection gear 23 by rotating the relay gear 22 provided therebetween. However, as described above, the base portion 20 and the actuator holder 7 are connected to each other such that the base portion 20 and the actuator holder 7 can rotate individually along the second operation plane P2 instead of rotating together. In addition, the first actuator 8 retained by the actuator retaining portion 7c receives a reaction force from the first cam surface 13a with which the first actuator 8 is constantly in contact, and is restrained from sliding along the first cam surface 13a. Therefore, even when the operation lever 2 is pivoted along the second operation plane P2, the actuator holder 7 does not move together with the operation lever 2. When the operation lever 2 is pivoted clockwise in FIG. 12, only the second actuator 9 generates a clicking sensation by moving over the crest of the second cam surface 13b, and is restrained at an end of the second cam surface 13b immediately after the generation of the clicking sensation. Thus, the movable support member 6 and the base portion 20 rotate to the position illustrated in FIG. 13, and are stopped. When the operation lever 2 is pivoted counterclockwise in FIG. 12, the second actuator 9 is not restrained at the other end of the second cam surface 13b, as illustrated in FIG. 14. Accordingly, when the operating force is removed, the second actuator 9 is pushed back to the trough of the second cam surface 13b, and the movable support member 6 and the base portion 20 automatically return to the state illustrated in FIG. 12. In response to the rotation of the movable support member 6 and the base portion 20, the detection gear 23 is rotated in a certain rotational direction by a certain amount. The variation in magnetic field caused by the variation in the rotational position of the permanent magnet 24 fixed to the detection gear 23 is detected by the magnetic sensor 25, so that the operation position of the operation lever 2 along the second operation plane P2 can be accurately detected. Accordingly, when the operation lever 2 is pivoted to the position illustrated in FIG. 13, a switch for causing the headlights to aim higher can be turned on in response to a detection signal output from the magnetic sensor 25. Similarly, when the operation lever 2 is pivoted to the position illustrated in FIG. 14, a switch for making the headlights flash can be turned on in response to a detection signal output from the magnetic sensor 25.

Figure 15:
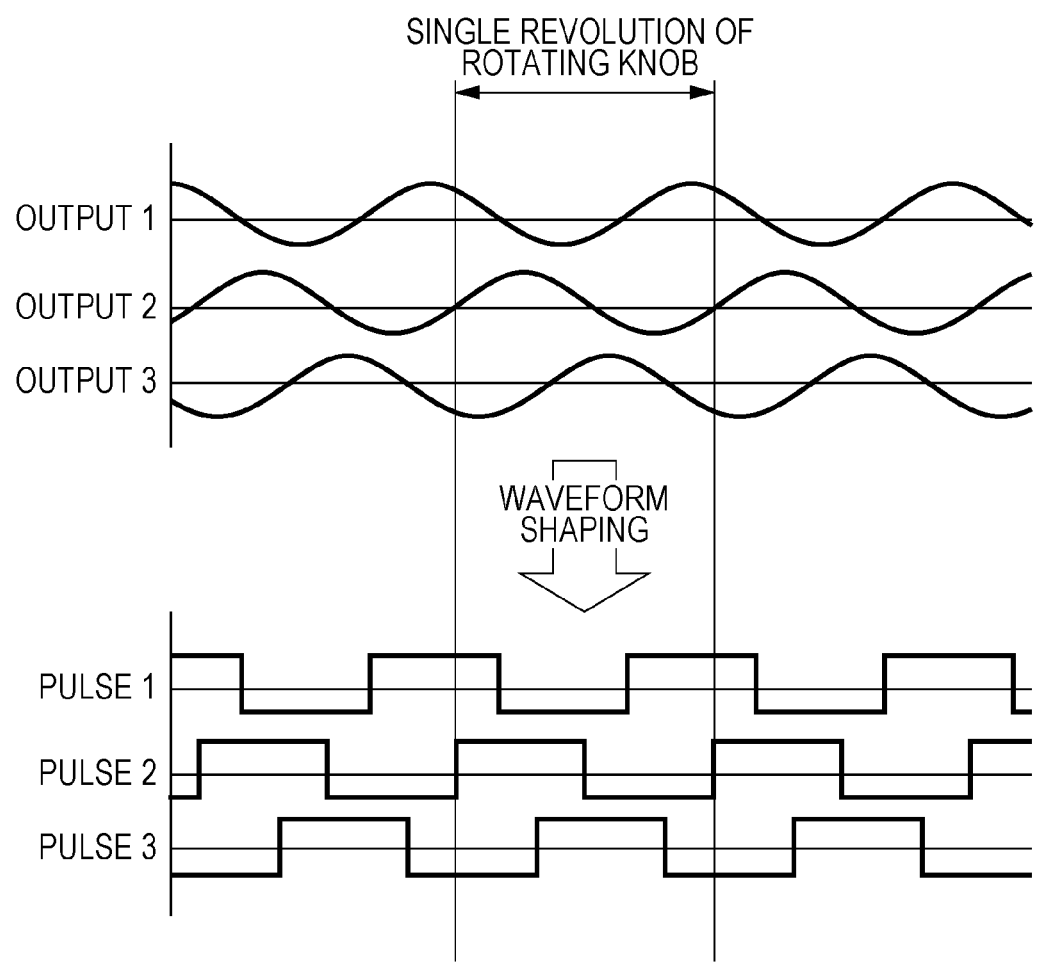
FIG. 15 is a diagram illustrating output waves output from a magnetic sensor for detecting an operation position of the rotating knob according to the first embodiment.

Next, the operations performed when the operation members, such as the rotating knob 3, on the operation lever 2 are operated will be described. When the user rotates the rotating knob 3, the ring gear 40 is rotated by the multiple lead portions 3a formed on the inner periphery of the rotating knob 3. Accordingly, the speed-increasing gears 41 to 43 that mesh with the internal teeth 40b of the ring gear 40 rotate together with the permanent magnets 51 to 53, respectively, at an increased rotational speed. The rotational directions and the rotational angles of the speed-increasing gears 41 to 43 are determined by the rotational direction of the rotating knob 3 and the amount of rotation thereof. When variations in magnetic fields caused by variations in the rotational positions of the permanent magnets 51 to 53 are detected by the magnetic sensors 61 to 63, output waves illustrated in the upper part of FIG. 15 are obtained. The waves are shaped into pulse waves illustrated in the lower part of FIG. 15. Six operation positions of the rotating knob 3 within a single revolution thereof can be easily and accurately detected on the basis of the combination of the pulse waves. In other words, variations in the rotational positions of the permanent magnets 51 to 53 can be accurately detected by the magnetic sensors 61 to 63, respectively, and the rotating knob 3 can be used as a high-resolution rotary switch that has six detectable operation positions. However, if the number of operation positions of the rotating knob 3 to be detectable is not large, only one or two of the speed-increasing gears 41 to 43 may be provided with a permanent magnet fixed thereto.

When the user slides the slide knob 4, the permanent magnet 54 rotates together with the gear 44. The operation position of the slide knob 4 can be accurately detected by detecting the variation in magnetic field caused by the variation in the rotational position of the permanent magnet 54 with the magnetic sensor 64. Thus, the operation member can be used as a high-reliability slide switch.

When the user presses the locker knob 5, the permanent magnet 55 rotates together with the gear 45. The operation position of the locker knob 5 can be accurately detected by detecting the variation in magnetic field caused by the variation in the rotational position of the permanent magnet 55 with the magnetic sensor 65. Thus, the operation member can be used as a high-reliability seesaw switch. In addition, when the locker knob 5 is pressed and the gear 45 is rotated, the operating portion 45a rotates the cam lever 46 and the coil springs 47 are elastically compressed. Accordingly, when the operating force is removed, the cam lever 46 is operated in the opposite direction by the resilience force applied by the coil springs 47 and drives the operating portion 45a so as to rotate the gear 45 to the original rotational position.

As described above, in the lever operation device according to the present embodiment, when the rotating knob 3 is rotated along the circumferential direction of the operation lever 2 and the ring gear 40 is rotated, the rotational direction of the ring gear 40 is changed to the direction along the circuit board 36. The ring gear 40 rotates the speed-increasing gears 41 to 43 at an increased speed. Thus, the permanent magnets 51 to 53 fixed to the speed-increasing gears 41 to 43, respectively, are rotated while gaps provided between the permanent magnets 51 to 53 and the magnetic sensors 61 to 63 are maintained at constant distances. In other words, the permanent magnets 51 to 53 rotate by a rotational angle larger than the rotational angle of the rotating knob 3 while facing the magnetic sensors 61 to 63, respectively, at positions close thereto. Thus, the operation position of the rotating knob 3 can be detected extremely accurately by detecting large variations in magnetic fields caused by the rotation of the permanent magnets 51 to 53 with the magnetic sensors 61 to 63. The power transmitting means for the rotating knob 3 includes the ring gear 40 having the external teeth 40a that mesh with the multiple lead portions (lead thread portion) 3a of the rotating knob 3 and the internal teeth 40b that mesh with the speed-increasing gears 41 to 43. Thus, the power transmitting means has a simple structure and high reliability. In addition, the speed-increasing ratio for the speed-increasing gears 41 to 43, that is, the speed-increasing ratio of the speed-increasing gears 41 to 43 with respect to the ring gear 40, can be increased, and the speed-increasing gears 41 to 43 can be rotated at a very high speed-increasing ratio. Accordingly, the operation position of the rotating knob 3 can be detected extremely accurately.

In the present embodiment, the rotating knob 3 is used as an operation member of a rotary switch. However, since an output signal that varies linearly can be obtained from the magnetic sensors, the rotating knob 3 may instead be used as an operation member of a rotary potentiometer. In addition, as described above, only one or two of the speed-increasing gears 41 to 43 may be provided with a permanent magnet fixed thereto in accordance with the use of the rotating knob 3. Also in this case, a high-reliability long-life rotary switch or rotary potentiometer may be provided.

In addition, in the lever operation device according to the present embodiment, the switch unit 30 is formed of a casing (the support case 34 and the cover case 35) that retains the speed-increasing gears 41 to 43, the ring gear 40, and the circuit board 36 at desired positions, and the switch unit 30 is installed in the operation lever 2. Thus, the switch unit 30 in which the power transmitting means and the detecting means for the rotating knob 3 are combined as a unit can be assembled to the operation lever 2, and the assembly efficiency can be increased. In addition to the power transmitting means and the detecting means for the rotating knob 3, those for the slide knob 4 and the locker knob 5, which are the operation members, are also disposed in the switch unit 30. Thus, a plurality of detecting means for a plurality of types of operation members 3, 4, and 5 are combined as a unit, and a lever operation device having high assembly efficiency and high functionality can be provided. In addition, in the present embodiment, the permanent magnets 51 to 55 having the same magnetic characteristics and the magnetic sensors 61 to 65 having the same detection characteristics are used as the detecting means for the operation members 3, 4, and 5. Thus, the lever operation device can be easily designed, and the detection accuracy and cost efficiency thereof can be easily increased.

The present invention can also be applied to a lever operation device having only the rotating knob 3 at the outer periphery of the operation lever 2. Thus, the number and kinds of the operation members other than the rotating knob 3 can be set as appropriate.

Figure 16:
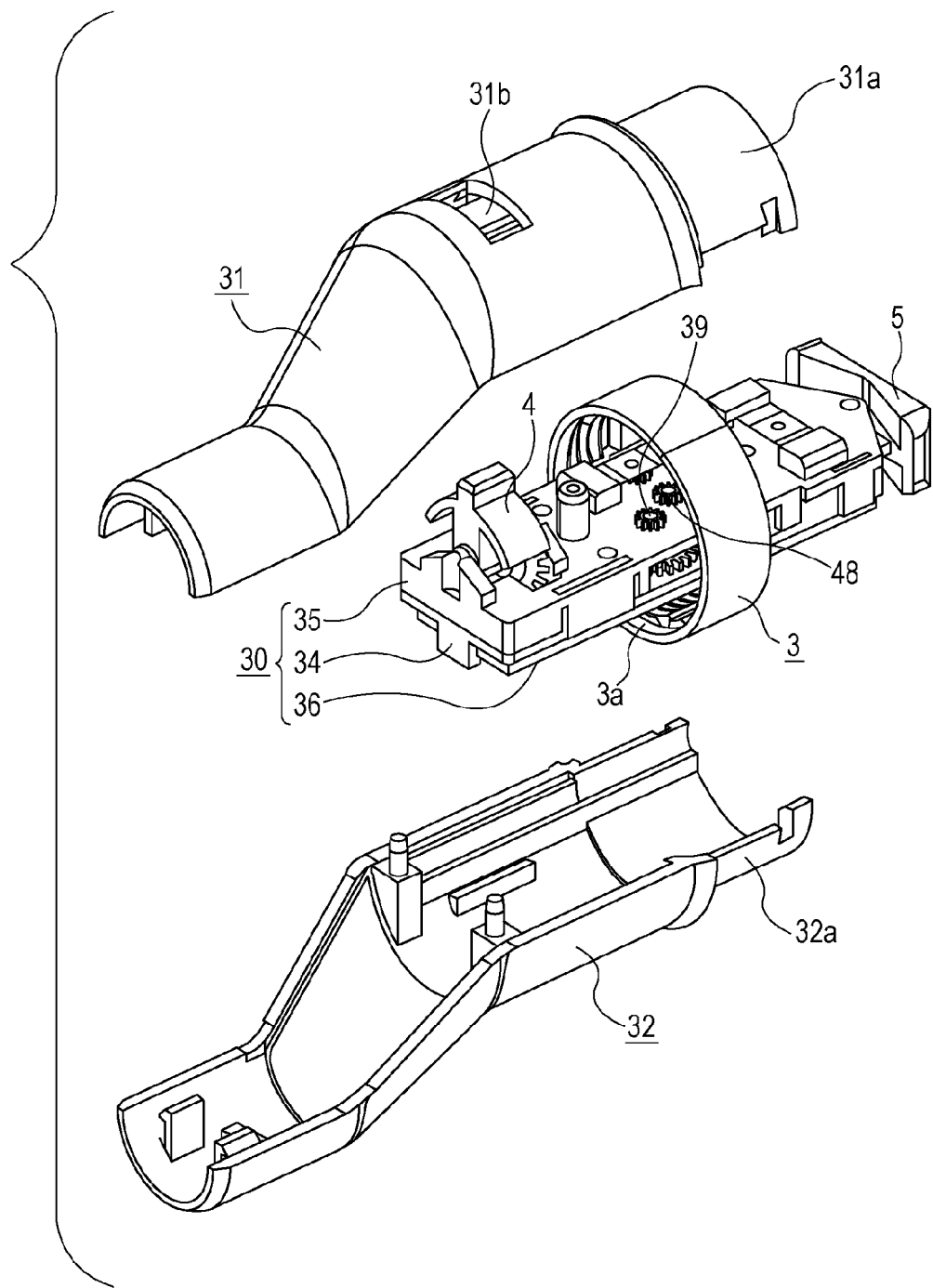
FIG. 16 is an exploded perspective view illustrating the operation lever included in a lever operation device according to a second embodiment of the present invention and the internal structure thereof.
Figure 17:
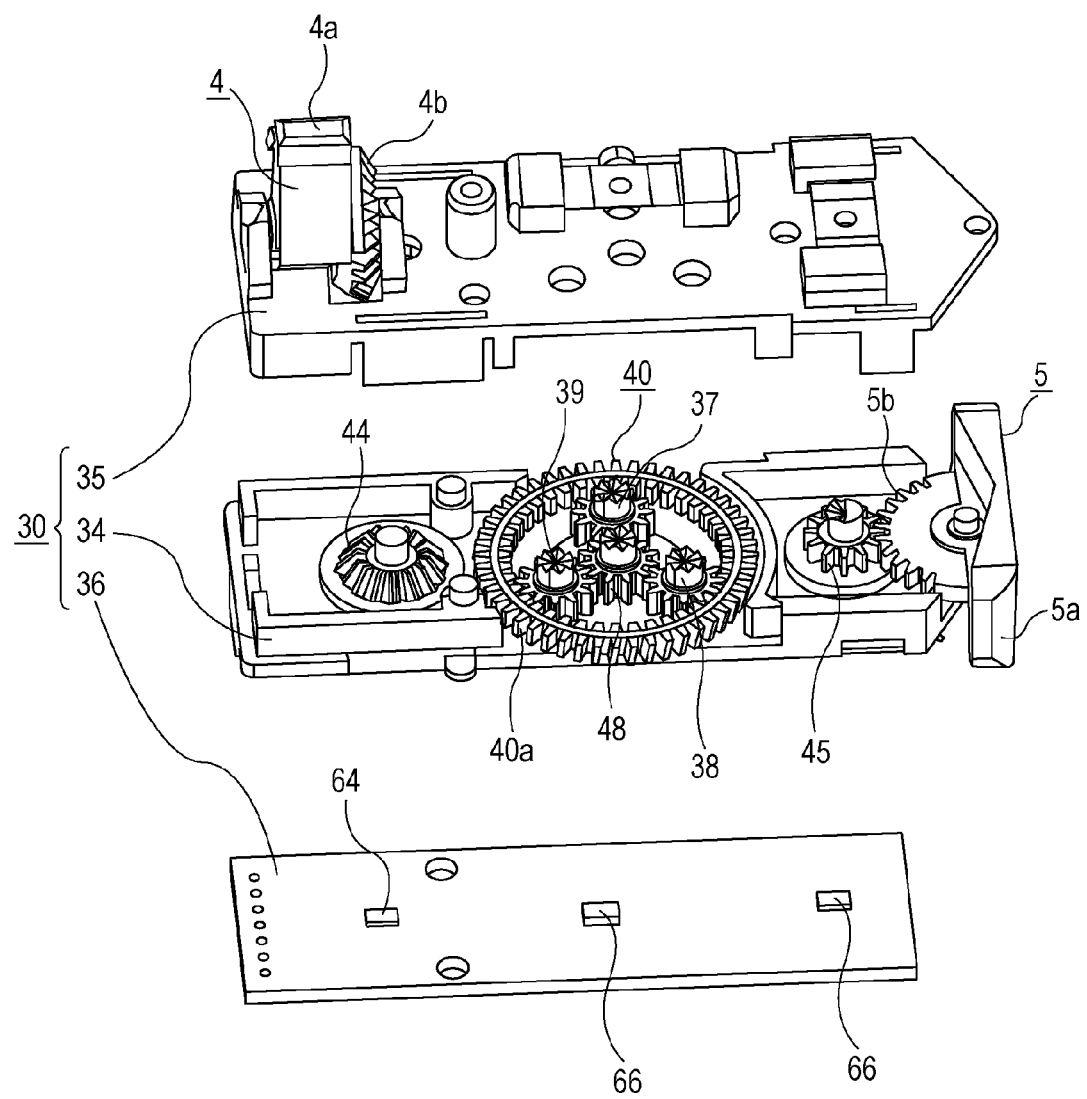
FIG. 17 is an exploded perspective view of a switch unit illustrated in FIG. 16.
Figure 18:
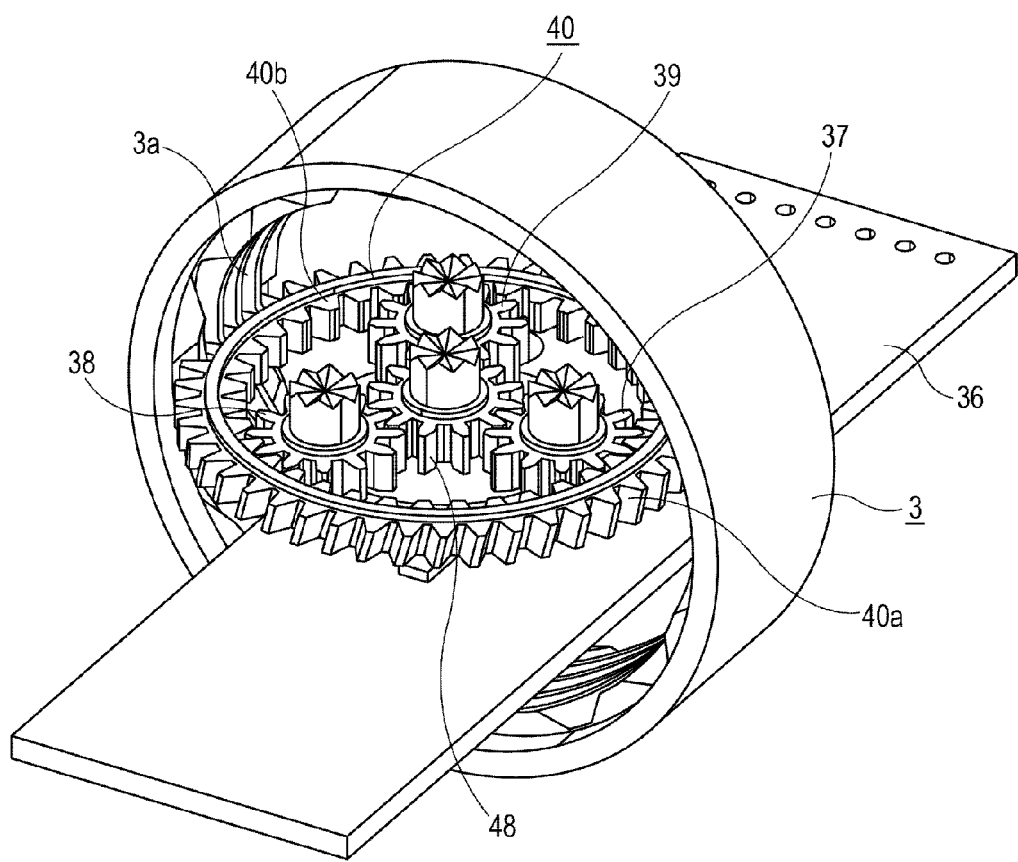
FIG. 18 is a perspective view of power transmitting means for a rotating knob according to the second embodiment.

Next, a lever operation device according to a second embodiment of the present invention will be described with reference to FIGS. 16 to 18. In FIGS. 16 to 18, components similar to those illustrated in FIGS. 2 and 6 to 8 are denoted by the same reference numerals, and explanations thereof will thus be omitted. In the present embodiment, means for returning the locker knob 5 to the original position is not installed.

In the second embodiment, when the rotating knob 3 is rotated, the ring gear 40 rotates three relay speed-increasing gears 37, 38, and 39 at an increased speed, and the three relay speed-increasing gears 37, 38, and 39 rotate a single speed-increasing gear 48 to which a permanent magnet (not shown) is attached. In other words, as is clear from FIGS. 17 and 18, in the present embodiment, the internal teeth 40b of the ring gear 40 mesh with the three relay speed-increasing gears 37, 38, and 39 that surround the speed-increasing gear 48, and the three relay speed-increasing gears 37, 38, and 39 mesh with the speed-increasing gear 48. When the rotating knob 3 is rotated, the ring gear 40 and the relay speed-increasing gears 37, 38, and 39, which are transmission gears, rotate the speed-increasing gear 48 at an increased speed.

Thus, the ring gear 40 rotates the speed-increasing gear 48 at an increased speed by rotating the relay speed-increasing gears 37, 38, and 39 which have no permanent magnets. A variation in magnetic field caused by a variation in the rotational position of the permanent magnet that rotates together with the speed-increasing gear 48 is detected by a magnetic sensor 66 that faces the permanent magnet at a position close thereto. Thus, similar to the first embodiment, the reliability and life of the power transmitting means for the rotating knob 3 can be increased. In this structure, the relay speed-increasing gears 37, 38, and 39, which mesh with the internal teeth 40b of the ring gear 40, are arranged such that each of the relay speed-increasing gears 37, 38, and 39 meshes with the speed-increasing gear 48. Accordingly, the speed-increasing gear 48 can rotate in a stable orientation without causing a shaft displacement. Thus, the mechanical stability is increased and the detection accuracy of the magnetic sensor 66 is further increased. As a result, a high reliability lever operation device can be obtained. In the second embodiment, the permanent magnet is fixed only to the speed-increasing gear 48 positioned at the rotational center of the ring gear 40. Accordingly, a relatively large sensor can be easily mounted on the circuit board 36 as the magnetic sensor 66 for the rotating knob 3. Thus, the detection accuracy can be easily increased by using a high-functionality magnetic sensor capable of performing two-phase detection simultaneously.

What is claimed is:

1. A lever operation device comprising:
   at least one operation member including a rotating knob attached to an outer peripheral portion of a cylindrical operation lever, the rotating knob being rotatable along a circumferential direction of the outer peripheral portion, the rotating knob having a lead thread portion provided on an inner peripheral surface thereof;
   a circuit board disposed in the operation lever so as to extend along an axial direction of the operation lever;
   a magnetic sensor mounted on the circuit board;
   a transmission gear driven by the lead thread portion of the rotating knob, the transmission gear rotating in a plane parallel to the circuit board;
   a speed-increasing gear driven by the transmission gear, the speed-increasing gear rotating in the plane parallel to the circuit board; and
   a permanent magnet fixed to the speed-increasing gear so as to face the magnetic sensor in a vicinity thereof,
   wherein the rotating knob rotates the speed-increasing gear via the transmission gear such that the permanent magnet rotates with respect to the magnetic sensor while maintaining a constant distance therebetween.

2. The lever operation device according to claim 1, further comprising:
   a switch unit installed in the operation lever, the switch unit including:
   a casing; and
   the circuit board, the speed-increasing gear, and the transmission gear provided in the casing.

3. The lever operation device according to claim 2, wherein the at least one operation member further comprises:
   at least one additional operation member arranged on the outer peripheral portion or an end portion of the operation lever; and
   at least one detecting unit configured to individually detect a respective operation of the at least one additional operation member, the at least one detecting unit being disposed in the switch unit.

4. The lever operation device according to claim 3, wherein the detecting unit includes:
   a magnetic sensor mounted on the circuit board;
   a rotating body to be rotated by the corresponding additional operation member; and
   a permanent magnet fixed to the rotating body so as to face the magnetic sensor with a constant distance therebetween.

5. The lever operation device according to claim 1,
   wherein the speed-increasing gear includes a plurality of speed-increasing gears, and the transmission gear is a ring gear having external teeth that mesh with the lead thread portion and internal teeth that mesh with the plurality of speed-increasing gears, and
   wherein the permanent magnet is fixed to at least one of the plurality of speed-increasing gears.

6. The lever operation device according to claim 1, further comprising a plurality of relay speed-increasing gears,
   wherein the transmission gear is a ring gear having external teeth that mesh with the lead thread portion and internal teeth that mesh with the plurality of relay speed-increasing gears, and
   wherein the speed-increasing gear meshes with the plurality of relay speed-increasing gears.

7. The lever operation device according to claim 1, wherein the permanent magnet rotates with a rotational angle greater than that of the transmission gear.

\* \* \* \* \*